United States Patent
Ho et al.

(10) Patent No.: US 7,560,337 B2
(45) Date of Patent: Jul. 14, 2009

(54) PROGRAMMABLE RESISTIVE RAM AND MANUFACTURING METHOD

(75) Inventors: ChiaHua Ho, Kaohsiung (TW); Erh-Kun Lai, Taichung County (TW); Kuang Yeu Hsieh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 66 days.

(21) Appl. No.: 11/426,213

(22) Filed: Jun. 23, 2006

(65) Prior Publication Data

US 2007/0173019 A1 Jul. 26, 2007

Related U.S. Application Data

(60) Provisional application No. 60/757,368, filed on Jan. 9, 2006.

(51) Int. Cl.
*H01L 21/336* (2006.01)

(52) U.S. Cl. .................. 438/257; 438/95; 257/E27.084

(58) Field of Classification Search .................. 438/257, 438/598, 672, 95, 288; 257/E27.084, 2, 3, 257/4, E21.577, E27.004, E45.002, 350
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,391,901 A | 2/1995 | Tanabe et al. | |
| RE35,232 E | 5/1996 | Stephens, Jr. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |

(Continued)

FOREIGN PATENT DOCUMENTS

CN 1462478 12/2003

(Continued)

OTHER PUBLICATIONS

Atwood, G, et al., "90nm Phase Change Technology with µ Trench and Lance Cell Elements," VLSI Technology, Systems and Applications, Apr. 23-25, 2007, pp. 1-2.

(Continued)

*Primary Examiner*—W. David Coleman
*Assistant Examiner*—Shaka Scarlett
(74) *Attorney, Agent, or Firm*—Kenta Suzue; Haynes Beffel & Wolfeld LLP (57) ABSTRACT

Programmable resistive RAM cells have a resistance that depends on the size of the contacts. Manufacturing methods and integrated circuits for lowered contact resistance are disclosed that have contacts of reduced size.

20 Claims, 6 Drawing Sheets

U.S. PATENT DOCUMENTS

| | | | |
|---|---|---|---|
| 5,688,713 A | 11/1997 | Linliu et al. | |
| 5,716,883 A | 2/1998 | Tseng et al. | |
| 5,754,472 A | 5/1998 | Sim et al. | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan | |
| 6,025,220 A | 2/2000 | Sandhu | |
| 6,031,287 A | 2/2000 | Harshfield | |
| 6,034,882 A | 3/2000 | Johnson et al. | |
| 6,046,951 A | 4/2000 | El Hajji et al. | |
| 6,066,870 A | 5/2000 | Siek | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,291,137 B1 | 9/2001 | Lyons et al. | |
| 6,314,014 B1 | 11/2001 | Lowrey et al. | |
| 6,316,348 B1 * | 11/2001 | Fu et al. | 438/636 |
| 6,320,786 B1 | 11/2001 | Chang et al. | |
| 6,326,307 B1 | 12/2001 | Lindley et al. | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 | 8/2002 | Harshfield | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,551,866 B1 | 4/2003 | Maeda et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,569,705 B2 | 5/2003 | Chiang et al. | |
| 6,576,546 B2 | 6/2003 | Gilbert et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,596,589 B2 | 7/2003 | Tseng et al. | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,620,715 B1 | 9/2003 | Blosse et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,674,115 B2 | 1/2004 | Hudgens et al. | |
| 6,677,678 B2 | 1/2004 | Biolsi et al. | |
| 6,709,887 B2 | 3/2004 | Moore et al. | |
| 6,744,088 B1 | 6/2004 | Dennison | |
| 6,746,892 B2 | 6/2004 | Lee et al. | |
| 6,750,079 B2 * | 6/2004 | Lowrey et al. | 438/95 |
| 6,750,101 B2 | 6/2004 | Lung et al. | |
| 6,768,665 B2 | 7/2004 | Parkinson et al. | |
| 6,791,102 B2 | 9/2004 | Johnson et al. | |
| 6,791,859 B2 | 9/2004 | Hush et al. | |
| 6,797,979 B2 | 9/2004 | Chiang et al. | |
| 6,800,504 B2 | 10/2004 | Li et al. | |
| 6,800,563 B2 | 10/2004 | Xu | |
| 6,805,563 B2 | 10/2004 | Ohashi et al. | |
| 6,808,991 B1 | 10/2004 | Tung et al. | |
| 6,815,704 B1 | 11/2004 | Chen | |
| 6,830,952 B2 | 12/2004 | Lung et al. | |
| 6,838,692 B1 | 1/2005 | Lung et al. | |
| 6,850,432 B2 | 2/2005 | Lu et al. | |
| 6,859,389 B2 | 2/2005 | Idehara et al. | |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,881,603 B2 | 4/2005 | Lai | |
| 6,888,750 B2 | 5/2005 | Walker et al. | |
| 6,894,304 B2 | 5/2005 | Moore | |
| 6,894,305 B2 | 5/2005 | Yi et al. | |
| 6,900,517 B2 | 5/2005 | Tanaka et al. | |
| 6,903,362 B2 | 6/2005 | Wyeth et al. | |
| 6,909,107 B2 | 6/2005 | Rodgers et al. | |
| 6,910,907 B2 | 6/2005 | Layadi et al. | |
| 6,927,410 B2 | 8/2005 | Chen | |
| 6,928,022 B2 | 8/2005 | Cho et al. | |
| 6,933,516 B2 | 8/2005 | Xu | |
| 6,936,544 B2 | 8/2005 | Huang et al. | |
| 6,936,840 B2 | 8/2005 | Sun et al. | |
| 6,937,507 B2 | 8/2005 | Chen | |
| 6,943,365 B2 | 9/2005 | Lowery et al. | |
| 6,969,866 B1 * | 11/2005 | Lowrey et al. | 257/3 |
| 6,972,428 B2 | 12/2005 | Maimon | |
| 6,972,430 B2 | 12/2005 | Casagrande et al. | |
| 6,977,181 B1 | 12/2005 | Raberg et al. | |
| 6,992,932 B2 | 1/2006 | Cohen | |
| 7,023,009 B2 | 4/2006 | Kostylev et al. | |
| 7,033,856 B2 | 4/2006 | Lung et al. | |
| 7,038,230 B2 | 5/2006 | Chen et al. | |
| 7,038,938 B2 | 5/2006 | Kang | |
| 7,042,001 B2 | 5/2006 | Kim et al. | |
| 7,054,183 B2 | 5/2006 | Rinerson et al. | |
| 7,067,837 B2 | 6/2006 | Hwang et al. | |
| 7,067,864 B2 | 6/2006 | Nishida et al. | |
| 7,067,865 B2 | 6/2006 | Lung et al. | |

| | | |
|---|---|---|
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,132,675 B2 | 11/2006 | Gilton |
| 7,154,774 B2 | 12/2006 | Bedeschi et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung et al. |
| 7,208,751 B2 | 4/2007 | Ooishi |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,269,052 B2 | 9/2007 | Segal |
| 7,277,317 B2 | 10/2007 | Le Phan et al. |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung |
| 7,394,088 B2 | 7/2008 | Lung |
| 7,397,060 B2 | 7/2008 | Lung |
| 7,423,300 B2 | 9/2008 | Lung et al. |
| 7,426,134 B2 | 9/2008 | Happ et al. |
| 7,449,710 B2 | 11/2008 | Lung |
| 2002/0070457 A1 | 6/2002 | Sun et al. |
| 2002/0113273 A1 | 8/2002 | Hwang et al. |
| 2003/0072195 A1 | 4/2003 | Mikolajick |
| 2003/0095426 A1 | 5/2003 | Hush et al. |
| 2003/0186481 A1 | 10/2003 | Lung |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1* | 8/2004 | Hideki et al. ............... 365/163 |
| 2004/0248339 A1 | 12/2004 | Lung |
| 2004/0256610 A1 | 12/2004 | Lung |
| 2005/0018526 A1* | 1/2005 | Lee ............................ 365/232 |
| 2005/0029502 A1 | 2/2005 | Hudgens |
| 2005/0062087 A1 | 3/2005 | Chen et al. |
| 2005/0093022 A1 | 5/2005 | Lung |
| 2005/0127349 A1 | 6/2005 | Horak et al. |
| 2005/0145984 A1 | 7/2005 | Chen et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157681 A1 | 7/2006 | Chen et al. |
| 2006/0163554 A1 | 7/2006 | Lankhorst et al. |
| 2006/0198183 A1 | 9/2006 | Kawahara et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289848 A1 | 12/2006 | Dennison |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0257300 A1 | 11/2007 | Ho et al. |
| 2007/0262388 A1 | 11/2007 | Ho et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |

| | | | |
|---|---|---|---|
| 2008/0101110 A1 | 5/2008 | Happ et al. | |
| 2008/0137400 A1 | 6/2008 | Chen et al. | |
| 2008/0164453 A1 | 7/2008 | Breitwisch et al. | |
| 2008/0165569 A1 | 7/2008 | Chen et al. | |

FOREIGN PATENT DOCUMENTS

| | | |
|---|---|---|
| WO | WO 00/45108 A1 | 8/2000 |
| WO | WO 00/79539 A1 | 12/2000 |
| WO | WO 01/45108 A1 | 6/2001 |

OTHER PUBLICATIONS

AHN, S. J. et al., "Highly Reliable 5nm Contact Cell Technology for 256Mb PRAM," VLSI Technology, Digest of Technical Papers, Jun. 14-16, 2005, pp. 98-99.

Gibson, G. A. et al., "Phase-change Recording Medium that Enables Ultrahigh-density Electron-beam Data Storage,"Applied Physics Letter, 2005, 3 pp., vol. 86.

Happ, T. D. et al., "Novel None-Mask Self-Heating Pillar Change Memory," 2006 Symposium on VLSI Technology, 2 pp.

Hudgens, S. et al., "Overview of Phase-Change Chalcogenide Non-volatile Memory Technology," MRS Bulletin, Nov. 2004, pp. 829-832.

"Magnetic Bit Boost," www.sciencenews.org <http://www.sciencenews.org>, Dec. 18 & 25, 2004, p. 389, vol. 166.

"New Memories Tap Spin, Gird for Battle," Science News, Apr. 3, 1999, p. 223, vol. 155.

"Optimized Thermal Capacitance in a Phase Change Memory Cell Design", IPCOM000141986D, IP.com Prior Art Database, Oct. 18, 2006, 4 pp.

Pirovano, Agostino et al., "Reliability Study of Phase-Change Non-volatile Memories," IEEE Transactions on Device and Materials Reliability, Sep. 2004, pp. 422-427, vol. 4, No. 3.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Schafft, Harry A. et al., "Thermal Conductivity Measurements of Thin Films Silicon Dioxide", Proceedings of the IEEE 1989 International Conference on Microelectronic Test Structures, vol. 2, No. 1, Mar. 1989, pp. 121-124.

"Thermal Conductivity of Crystalline Dielectrics" in CRC Handbook of Chemistry and Physics, Internet Version 2007, (87th edition), David R. Lide, ed. Taylor and Francis, Boca Raton, FL.

Wuttig, Matthias, "Towards a Universal Memory?" Nature Materials, Apr. 2005, pp. 265-266, vol. 4.

Adler, David, "Amorphous-Semiconductor Devices," Sci. Amer., vol. 236, pp. 36-48, May 1977.

Adler, D. et al., "Threshold Switching in Chalcogenide-Glass Thin Films," J. Appl/Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pp.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at $3^{rd}$ E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM,"2003 Symposium on VLSI Technology Digest of Technical Papers, pp. 177-178.

Hwang, Y. N. et al., "Full Integration and Reliability Evaluation of Phase-change RAM Based on 0.24μm-CMOS Technologies,"2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM,"IEEE $43^{rd}$ Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan e. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallizaed Single-Grain 100-nm TFT+s for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonv olatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI 1996.

Wolf, Stanley, Excerpt from: Silicon Processing for the VLSI Era-vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Axon Technologies Corporation paper: Technology Description, published on Axon website in 1997, pp. 1-6. No Month Given.

* cited by examiner

PROGRAMMABLE RESISTIVE RAM AND MANUFACTURING METHOD

REFERENCE TO RELATED APPLICATION

This application claims the benefit of U.S. Provisional Application No. 60/757,368, filed 9 Jan. 2006 by inventors ChiaHua Ho, Erh-Kun Lai and Kuang-Yue Hsieh entitled Process of Resistance Random Access Memory.

BACKGROUND OF THE INVENTION

1. Field of the Invention

The invention relates to integrated circuit nonvolatile memory. In particular, the invention relates to programmable resistive nonvolatile memory, such as phase change memory.

2. Description of Related Art

Nonvolatile memory stores data without requiring a continuous supply of power. Programmable resistive memory such as phase change memory is an example of nonvolatile memory. A high current reset electrical pulse melts and quenches the programmable resistive element into an amorphous state, raising the resistance of the programmable resistive element. A low current set electrical pulse crystallizes and lowers the resistance of the programmable resistive element.

Because the electrical pulse type determines the data that are stored in the programmable resistive RAM, and the characteristics of the electrical pulse depend in part on the resistance of the programmable resistive RAM cells, it is critical to manufacture the programmable resistive RAM cells with the correct resistance.

The resistance of the programmable resistive RAM cells is reduced by shrinking the size of the electrical contacts that connect the programmable resistive RAM cells to the remainder of the integrated circuit. A traditional solution to forming small electrical contacts is to rely on a photolithographic mask that defines the small electrical contacts. However, such a mask is associated with accompanying problems, such as proper alignment of the mask with the already fabricated layers of the planar integrated circuit.

Therefore, it would be desirable to manufacture small electrical contacts for programmable resistive RAM without relying on an aggressive photolithography mask to define the small electrical contacts.

SUMMARY OF THE INVENTION

Embodiments of the technology include a self-aligned method of forming an integrated circuit with nonvolatile memory cells. The following steps are included:

The step of forming conductive rows accessing the nonvolatile memory cells by row.

The step of forming dielectric layers above the conductive rows. In one embodiment, these dielectric layers include multiple layers, at least two of which have an etching selectivity difference between the layers.

The step of forming interlayer contacts through the dielectric layers to conductively connect with the conductive rows.

The step of reducing a cross-section of a part of the interlayer contacts in a self-aligned process. This reduction process is performed in some embodiments by forming dielectric structures at least partly covering the interlayer contacts, and reducing a cross-section of a part of the interlayer contacts by removing material from a part of the interlayer contacts uncovered by the dielectric structures. One example of reducing the cross-section is performed as follows. A dielectric layer is exposed by the interlayer contacts, by removing another dielectric layer at least by the interlayer contacts. A new dielectric layer is formed at least partly covering the interlayer contacts. Only part of the new dielectric layer covering the interlayer contacts is removed, to leave dielectric structures at least partly covering the interlayer contacts. One example of removing the new material is by wet etching part of the new dielectric layer for a duration, which controls a critical dimension of the interlayer contacts achieved by reducing the cross-section. In one embodiment, the dielectric structures have a substantially triangle-shaped cross-section. Finally, a cross-section of a part of the interlayer contacts is reduced by removing material from a part of the interlayer contacts uncovered by the dielectric structures. In one embodiment, the cross-section of the interlayer contacts is reduced by dry etching the part of the interlayer contacts uncovered by the dielectric structures. In one embodiment, the critical dimension of the interlayer contacts is controlled to be less than or equal to about 60 nm.

The step of forming programmable resistive elements of the nonvolatile memory cells to conductively connect with the interlayer contacts. Example materials for forming the programmable resistive elements are: a chalcogenide, $Pr_{x}Ca_{y}MnO_3$, $PrSrMnO_3$, $ZrO_x$, a two-element memory compound, TCNQ, and PCBM.

The step of forming conductive columns accessing the nonvolatile memory cells by column to conductively connect with the programmable resistive elements.

Some embodiments include the step of: surrounding the interlayer contacts with additional dielectric structures to fill gaps between the interlayer contacts and the dielectric layers. The gaps result from the step of reducing the cross-section. The additional dielectric structures have a thermal conductivity sufficiently low to reduce a reset current.

Further embodiments of the technology include an integrated circuit with nonvolatile memory cells. The integrated circuit includes conductive rows accessing the nonvolatile memory cells by row, dielectric layers above said conductive rows, programmable resistive elements of the nonvolatile memory cells above the dielectric layers, interlayer contacts through the dielectric layers to conductively connect with the conductive rows, and conductive columns accessing the nonvolatile memory cells by column to conductively connect with the programmable resistive elements.

Each of the interlayer contacts has a first part and second part. The first part is adjacent to and conductively connects to at least one of the programmable resistive elements. In some embodiments, the cross-section of the first part has a critical dimension less than or equal to about 60 nm. The second part is adjacent to and conductively connects to the first part. The second part is also conductively connected to the conductive rows. The second part has a cross-section larger than the cross-section of the first part. The cross-section of the second part is substantially uniform between the first part and the conductive rows.

DETAILED DESCRIPTION

Various embodiments are directed at a manufacturing method for memory, such as nonvolatile embedded memory implementing programmable resistance RAM. Examples of resistance device RAM are resistance memory (RAM), polymer memory, and phase change memory (PCRAM). The cross-section is reduced of an upper portion of the interlayer contacts of programmable resistance RAM.

Figure 1:
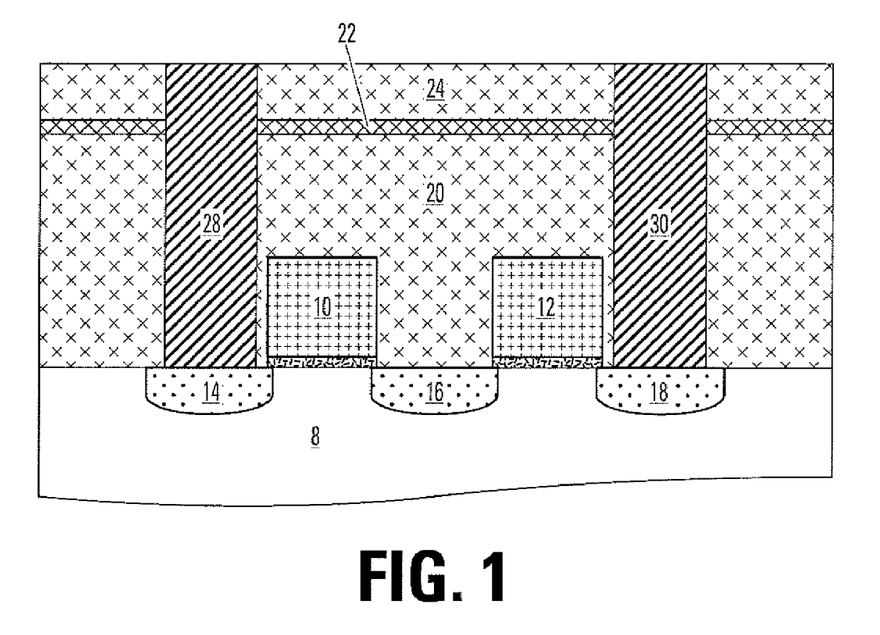
FIG. 1 is a cross-sectional view showing transistor structure to select particular programmable resistive RAM cells by row.

FIG. 1 is a cross-sectional view showing transistor structure to select particular programmable resistive RAM cells by row. The substrate 8 (which may also be an n-well or p-well) has source and drain regions 14, 16, and 18. The gates 10 and 12 are conductive rows which selectively access the programmable resistive RAM cells, and induce a channel under the respective regions of the substrate 8 under the gates 10 and 12, between regions 14 and 16 and regions 16 and 18. Dielectric layers 20, 22, and 24 cover the substrate 8 and the gates 10 and 12. Interlayer contacts 28 and 30 physically and electrically connect to regions 14 and 18 through dielectric layers 20, 22, and 24. Example materials of dielectric layer 20 and 24 are oxides such as $SiO_x$ and low-k material, and other dielectric materials associated with transistor fabrication. An example thickness of dielectric layer 20 is 600 nm, and an example thickness range of dielectric layer 24 is 100-200 nm. An example material of dielectric layer 22 is SiN, and an example thickness of dielectric layer 22 is 30 nm. Example materials of interlayer contacts 28 and 30 are W, polycrystalline Si without doping or with p or n doping (such as n+ doped polycrystalline Si).

Figure 2:
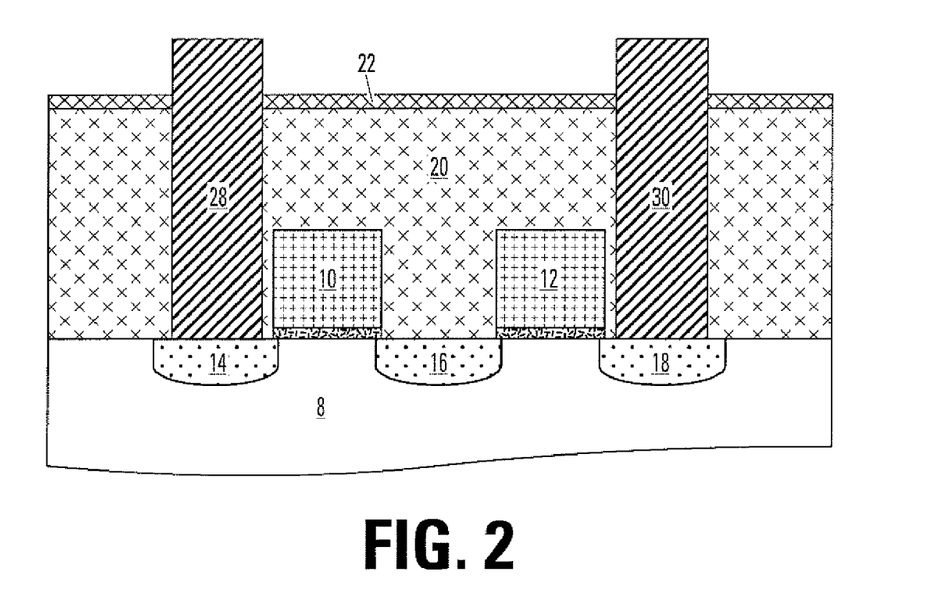
FIG. 2 is a cross-sectional view showing the removal of a top layer of dielectric, stopping on the next layer of dielectric.

FIG. 2 is a cross-sectional view showing the removal of a top layer of dielectric, stopping on the next layer of dielectric. Dielectric layer 24 is removed, exposing dielectric layer 22 and an upper portion of the interlayer contacts 28 and 30. Wet etching, dry etching, or some combination of wet etching and dry etching, are alternative methods to remove dielectric layer 24. One example is wet etching with dilute HF (DHF) or buffer HF (BHF) to wet etch silicon oxide. The etching selective difference between dielectric layer 22 and dielectric layer 24 is sufficiently high, such that the removal of material stops at dielectric layer 22.

Figure 3:
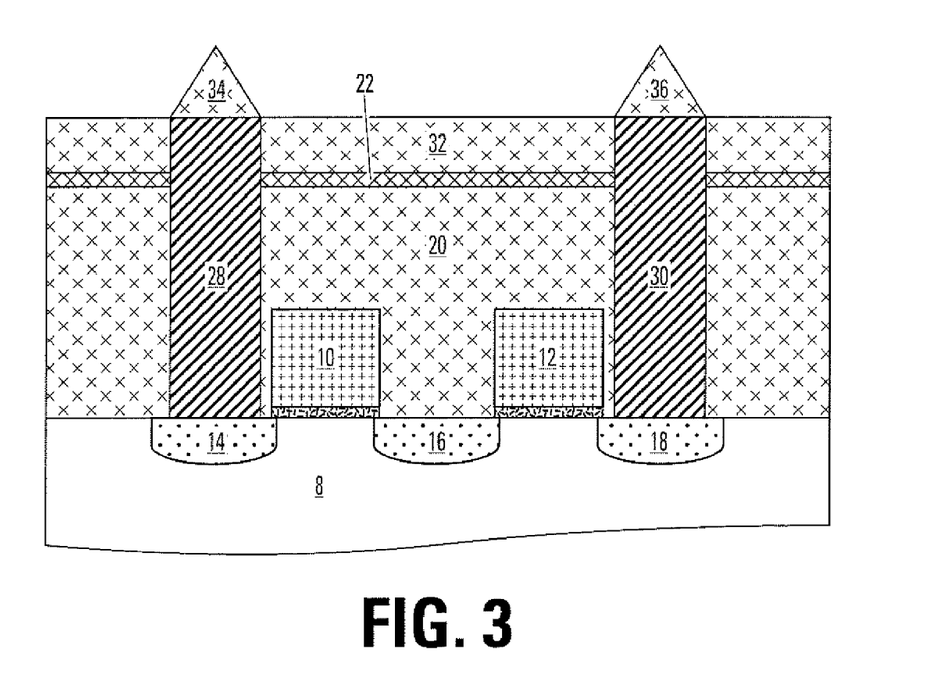
FIG. 3 is a cross-sectional view showing the formation of a new layer of dielectric, including dielectric structures on the contacts having a substantially triangle-shaped cross-section.

FIG. 3 is a cross-sectional view showing the formation of a new layer of dielectric, including dielectric structures on the contacts having a substantially triangle-shaped cross-section. High-density plasma (HDP) oxide layer 32 and structures 34 and 36 having a substantially triangular-cross section are deposited. An example thickness range of oxide layer 32 is 150-300 nm. Structures 34 and 36 cover the interlayer contacts 28 and 30. Alternatively, part of contacts 28 and 30 remain exposed.

Figure 4:
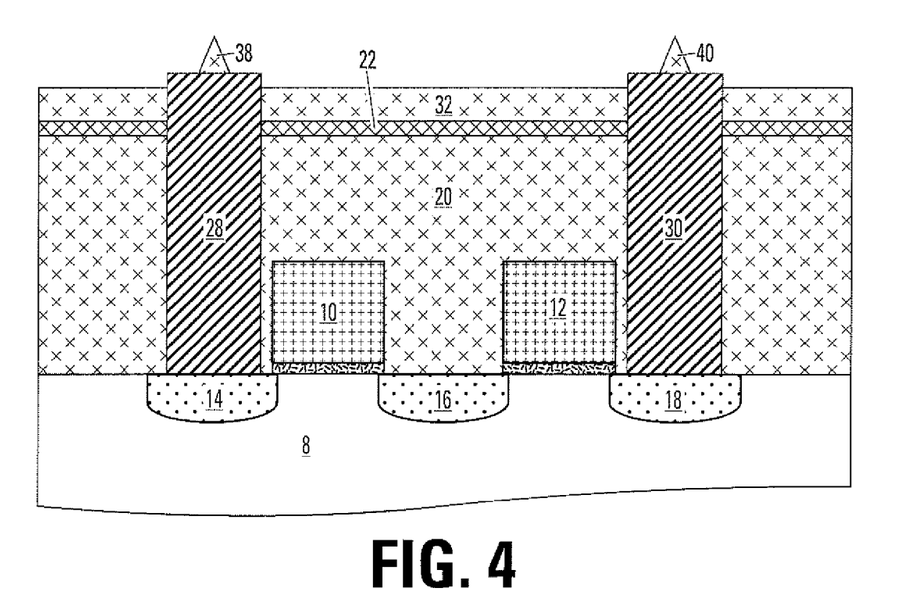
FIG. 4 is a cross-sectional view showing the removal of part of the new layer of dielectric, including part of the dielectric structures on the contacts having a substantially triangle-shaped cross-section.

FIG. 4 is a cross-sectional view showing the removal of part of the new layer of dielectric, including part of the dielectric structures on the contacts having a substantially triangle-shaped cross-section. Wet etching, dry etching, or some combination of wet etching and dry etching, are alternative methods. In one example, dilute HF (DHF) or buffer HF (BHF) are used to wet etch a silicon oxide layer 32 and structures 34 and 36. Removal of material from structures 34 and 36 shrinks their triangular cross-section, resulting in structures 38 and 40. Contacts 28 and 30, which were formerly completely covered by structures 34 and 36 are now partly exposed by structures 38 and 40. Alternatively, an already exposed part of contacts 28 and 30 is increased in area. The etching selectivity difference between contacts 28 and 30, and layer 32 and structures 34 and 36 is sufficiently high to prevent significant etching of contacts 28 and 30. However, layer 32 is etched during the etching of structures 34 and 36.

Figure 5:
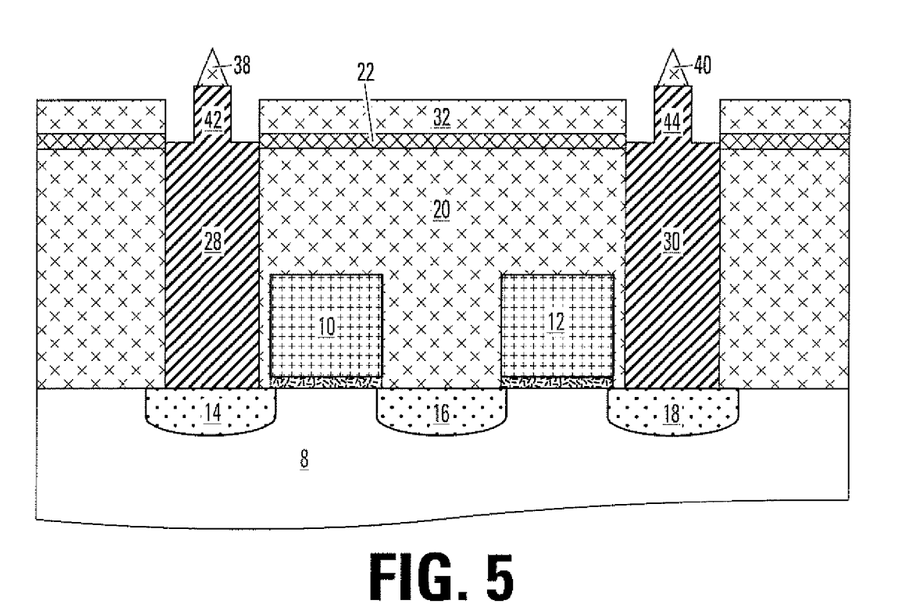
FIG. 5 is a cross-sectional view showing the removal of part of the contacts uncovered by the remainder of the substantially triangle-shaped dielectric structures.

FIG. 5 is a cross-sectional view showing the removal of part of the contacts uncovered by the remainder of the substantially triangle-shaped dielectric structures. Wet etching, dry etching, or some combination of wet etching and dry etching, are alternative methods. In one example, reactive-ion-etch with $SF_6$ based chemistry is used for dry etching the contacts 28 and 30. In effect, the substantially triangular-shaped structures 38 and 40 are used a as a hard mask to prevent etching of the parts of contacts 28 and 30 under structures 38 and 40. The etching selectivity difference between contacts 28 and 30, and structures 38 and 40, is sufficiently high to prevent significant etching of structures 38 and 40. The etching time is controlled to etch the contacts 28 and 30 to a suitable depth of for example 200 nm. Contacts 28 and 30 now have respective portions 42 and 44 with smaller cross-sections.

Figure 6:
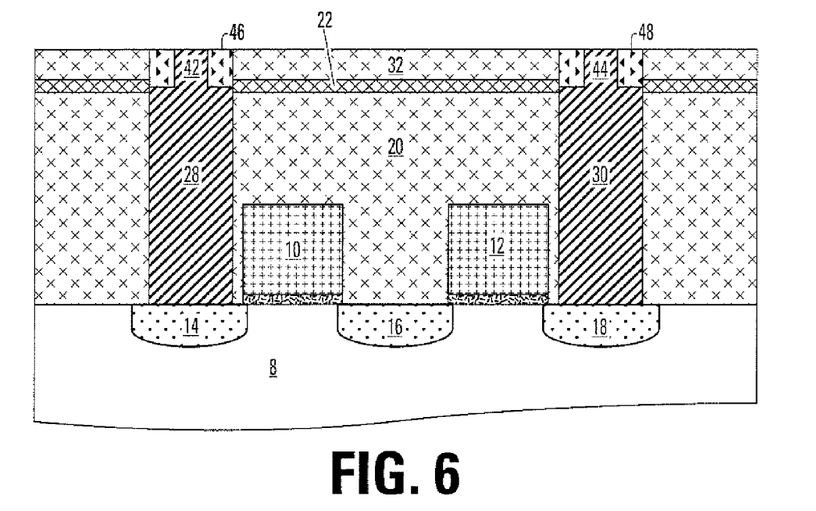
FIG. 6 is a cross-sectional view showing the formation of dielectric in the gaps around the contacts resulting from the prior removal of part of the contacts, and removal of material to flatten the surface.

FIG. 6 is a cross-sectional view showing the formation of dielectric in the gaps around the contacts resulting from the prior removal of part of the contacts, and removal of material to flatten the surface. Dielectric structures 46 and 48 are deposited into the volume left open by the removal of part of the contacts 28 and 30. Thus, dielectric structures 46 and 48 surround contact portions 42 and 44. Examples of materials for dielectric structures 46 and 48 are low-k material, HDP oxide, and Accuflow with a suitable post-annealing temperature of for example 400° C.

Chemical mechanical polishing (CMP) planarizes the surface and opens the contact portions 42 and 44 covered by the formation of dielectric structures 46 and 48. An example critical dimension of the contact portions 42 and 44 is 60 nm.

Figure 7:
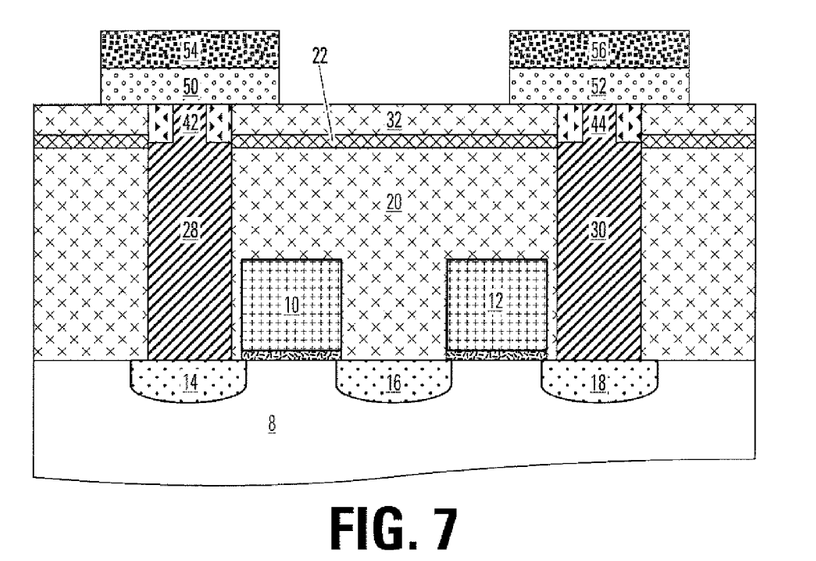
FIG. 7 is a cross-sectional view showing the formation of resistive memory elements and top electrodes.

FIG. 7 is a cross-sectional view showing the formation of resistive memory elements and top electrodes.

The programmable resistive elements 50 and 52 physically and electrically connect with contact portions 42 and 44.

Embodiments of the memory cell include phase change based memory materials, including chalcogenide based materials and other materials, for the resistive element. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb\ 100\text{-}(a+b)$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 patent, cols 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to be as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, $PrSrMnO_3$, $ZrO_x$, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, $C_{60}$-TCNQ, TCNQ doped with other metal, or any other polymer material that has bistable or multi-stable resistance state controlled by an electrical pulse.

The following are short summaries describing four types of resistive memory materials. The first type is chalcogenide material, such as $Ge_xSb_yTe_z$ where x:y:z=2:2:5, or other compositions with x: 0~5; y: 0~5; z: 0~10. GeSbTe with doping, such as N-, Si-, Ti-, or other element doping is alternatively used.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimater with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

A second type of memory material suitable for use in embodiments is colossal magnetoresistance ("CMR") material, such as $Pr_xCa_yMnO_3$ where x=0.5:0.5, or other compositions with x: 0~1; y: 0~1. CMR material that includes Mn oxide is alternatively used.

An exemplary method for forming CMR material uses PVD sputtering or magnetron-sputtering method with source gases of Ar, $N_2$, $O_2$, and/or He, etc. at the pressure of 1 mTorr~100 mTorr. The deposition temperature can range from room temperature to ~600° C., depending on the post deposition treatment condition. A collimater with an aspect ratio of 1~5 can be used to improve the fill-in performance. To improve the fill-in performance, the DC bias of several tens of volts to several hundreds of volts is also used. On the other hand, the combination of DC bias and the collimater can be used simultaneously. A magnetic field of several tens of Gauss to as much as a Tesla (10,000 Gauss) may be applied to improve the magnetic crystallized phase.

A post-deposition annealing treatment in vacuum or in an $N_2$ ambient or $O_2/N_2$ mixed ambient is optionally used to improve the crystallized state of CMR material. The annealing temperature typically ranges from 400° C. to 600° C. with an anneal time of less than 2 hours.

The thickness of CMR material depends on the design of the cell structure. The CMR thickness of 10 nm to 200 nm can be used for the core material. A buffer layer of YBCO (YBaCuO$_3$, which is a type of high temperature superconductor material) is often used to improve the crystallized state of CMR material. The YBCO is deposited before the deposition of CMR material. The thickness of YBCO ranges from 30 nm to 200 nm.

A third type of memory material is two-element compounds, such as $Ni_xO_y$; $Ti_xO_y$; $Al_xO_y$; $W_xO_y$; $Zn_xO_y$; $Zr_xO_y$; $Cu_xO_y$; etc, where x:y=0.5:0.5, or other compositions with x: 0~1; y: 0~1. An exemplary formation method uses a PVD sputtering or magnetron-sputtering method with reactive gases of Ar, $N_2$, $O_2$, and/or He, etc. at the pressure of 1 mTorr ~100 mTorr using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimater with an aspect ratio of 1~5 can be used to improve the fill-in performance. To improve the fill-in performance, the DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

An alternative formation method uses a PVD sputtering or magnetron-sputtering method with reactive gases of Ar/$O_2$, Ar/$N_2$/$O_2$, pure $O_2$, He/$O_2$, He/$N_2$/$O_2$ etc. at the pressure of 1 mTorr~100 mTorr, using a target of metal oxide, such as Ni, Ti, Al, W, Zn, Zr, or Cu etc. The deposition is usually done at room temperature. A collimater with an aspect ratio of 1~5 can be used to improve the fill-in performance. To improve the fill-in performance, a DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minute to hours. Another oxidation method is plasma oxidation. An RF or a DC source plasma with pure $O_2$ or Ar/$O_2$ mixed gas or Ar/$N_2$/$O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A fourth type of memory material is a polymer material, such as TCNQ with doping of Cu, $C_{60}$, Ag etc. or PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of $10^{-4}$ Torr to $10^{-10}$ Torr. The wafer temperature ranges from room temperature to 200° C.

A post-deposition annealing treatment in vacuum or in an $N_2$ ambient is optionally performed to improve the composition distribution of polymer material. The annealing temperature ranges from room temperature to 300° C. with an anneal time of less than 1 hour.

Another technique for forming a layer of polymer-based memory material is to use a spin-coater with doped-TCNQ solution at a rotation of less than 1000 rpm. After spin-coating, the wafer held (typically at room temperature or temperature less than 200° C.) for a time sufficient for solid-state formation. The hold time ranges from several minutes to days, depending on the temperature and on the formation conditions.

The conductive top electrodes 54 and 56 physically and electrically connect with programmable resistive elements 50 and 52. Example materials of top electrodes 54 and 56 are single layer and multilayered. Single layered top electrodes 54 and 56 have low thermal conductivity, and are, for example, TiN, TaN, LaNiO$_3$, etc. Multilayered top electrodes 54 and 56 are, for example, TiN/AlCu, TaN/Cu, etc.

Finally, the stacks of programmable resistive elements 50 and 52 and conductive top electrodes 54 and 56 are etched. The stack etch of programmable resistive elements 50 and 52 and conductive top electrodes 54 and 56 can be defined by a non-aggressive mask, because the stack feature sizes are larger than the critical dimension of the contact portions 42 and 44. Wet etching, dry etching, or some combination of wet etching and dry etching, are alternative methods. For example, dry etching uses chemistries such as $CL_2$, $BCl_3$, etc. The etching selectivity difference is sufficiently high that the oxide layer 32 is not significantly etched.

Figure 8:
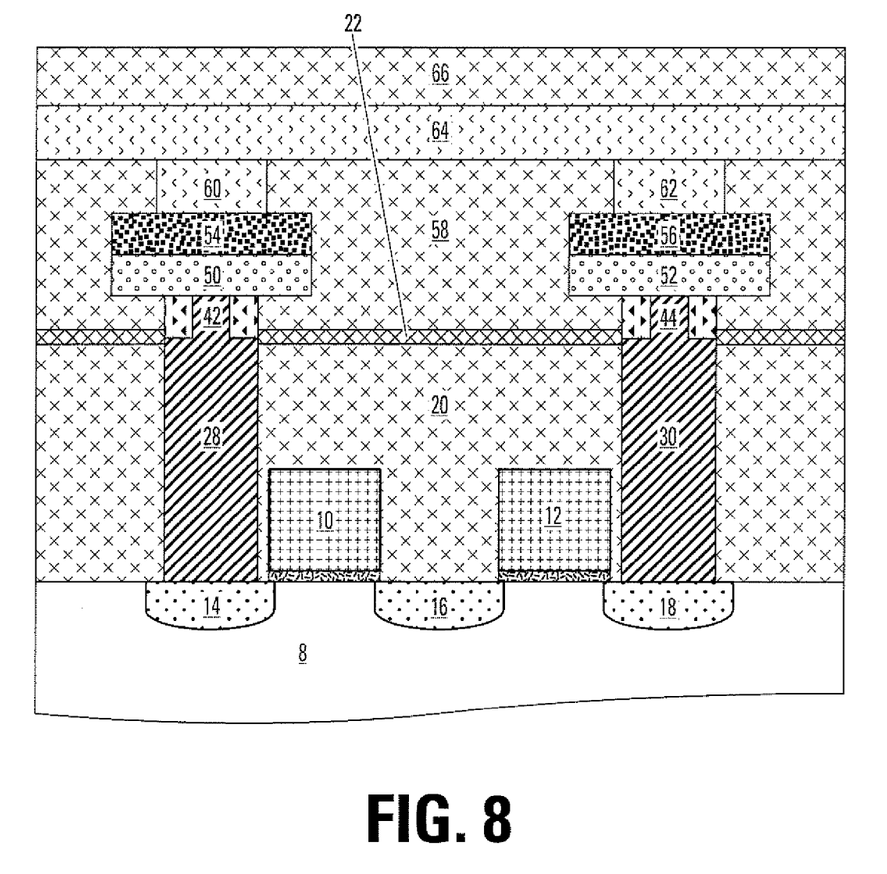
FIG. 8 is a cross-sectional view showing the formation of bit lines and an additional layer of dielectric.

FIG. 8 is a cross-sectional view showing the formation of bit lines and an additional layer of dielectric. Intermetal dielectric 58 is deposited, which can be silicon oxide, HDP oxide, plasma enhanced (PE) oxide, etc. Vias 60 and 62 are formed to physically and electrically connect with the top electrodes 54 and 56. Vias 60 and 62 are filled, and metal bit lines 64 that access the programmable resistive RAM cells by column. Example materials for the vias 60 and 62 are W and for the metal bit lines 64 are AlCu. An all Cu processes is another alternative.

Figure 9:
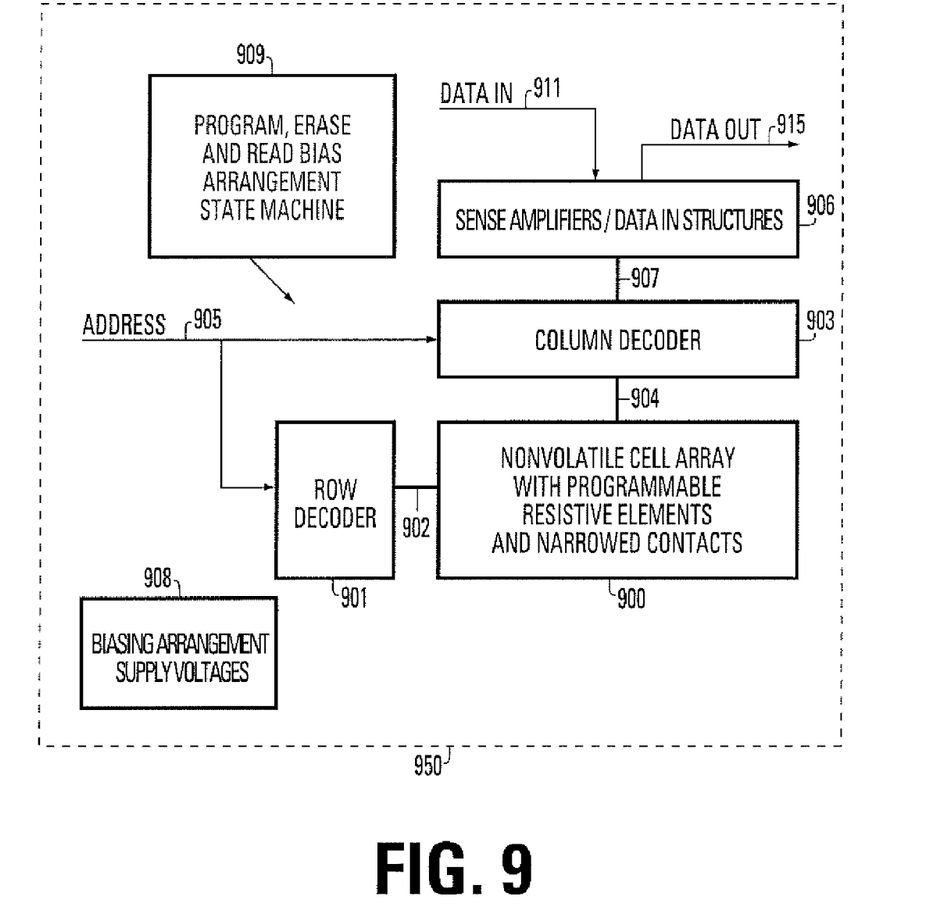
FIG. 9 is a block diagram of the integrated circuit including an array of nonvolatile programmable resistive memory cells, and other circuitry.

FIG. 9 is a block diagram of the integrated circuit including an array of nonvolatile programmable resistive memory cells, and other circuitry.

The integrated circuit 950 includes a memory array 900 implemented using memory cells with resistive elements on a semiconductor substrate. The memory array 900 has contacts with a narrowed cross-section as described herein. Addresses are supplied on bus 905 to column decoder 903 and row decoder 901. Sense amplifiers and data-in structures in block 906 are coupled to the column decoder 903 via data bus 907. Data is supplied via the data-in line 911 from input/output ports on the integrated circuit 950, or from other data sources internal or external to the integrated circuit 950, to the data-in structures in block 906. Data is supplied via the data-out line 915 from the block 906 to input/output ports on the integrated circuit 950, or to other data destinations internal or external to the integrated circuit 950. The integrated circuit 950 may also include circuitry directed a mission function other than the nonvolatile storage with resistive elements (not shown).

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of forming an integrated circuit with nonvolatile memory cells, comprising:
    forming conductive rows accessing the nonvolatile memory cells by row;
    forming dielectric layers above said conductive rows, the dielectric layers including a first dielectric layer and a second dielectric layer above the first dielectric layer, the first dielectric layer and the second dielectric layer having different etch rates;
    forming interlayer contacts through the dielectric layers to conductively connect with the conductive rows;
    reducing a cross-section of a part of the interlayer contacts;
    forming programmable resistive elements of the nonvolatile memory cells over the interlayer contacts, the interlayer contacts including a first part adjacent to and conductively connected to at least one of the programmable resistive elements, the first part having a top surface, wherein the top surface is higher than the second dielectric layer; and
    forming conductive columns accessing the nonvolatile memory cells by column to conductively connect with the programmable resistive elements.

2. The method of claim 1, wherein said forming dielectric layers includes:
    forming a first dielectric layer above said conductive rows; and
    forming a second dielectric layer at least partly above the first dielectric layer, wherein the first and second dielectric layers have an etching selectivity difference.

3. The method of claim 1, wherein said reducing the cross-section includes:
    controlling a critical dimension of the interlayer contacts to be less than or equal to about 60 nm.

4. The method of claim 1, wherein said reducing the cross-section includes:
    forming dielectric structures at least partly covering the interlayer contacts prior to said removing part of the interlayer contacts; and
    wherein said reducing a cross-section of a part of the interlayer contacts includes removing material from part of the interlayer contacts uncovered by the dielectric structures.

5. The method of claim 1, wherein said reducing the cross-section includes:
    forming a second dielectric layer at least partly covering the interlayer contacts;
    removing only part of the second dielectric layer covering the interlayer contacts to leave dielectric structures at least partly covering the interlayer contacts; and
    reducing a cross-section of a part of the interlayer contacts by removing material from a part of the interlayer contacts uncovered by the dielectric structures.

6. The method of claim 5, wherein said removing only part of the second dielectric layer includes:
    wet etching said part of the second dielectric layer.

7. The method of claim 5, wherein said removing only part of the second dielectric layer includes:
    wet etching said part of the second dielectric layer for a duration, wherein the duration controls a critical dimension of said part of the interlayer contacts achieved by said reducing the cross-section.

8. The method of claim 5, wherein said forming the second dielectric layer includes:
    forming the dielectric structures covering the interlayer contacts, the dielectric structures having a substantially triangle-shaped cross-section.

9. The method of claim 5, wherein said reducing the cross-section includes:
    dry etching the part of the interlayer contacts uncovered by the dielectric structures.

10. The method of claim 1, further comprising:
    surrounding the interlayer contacts with dielectric structures to fill gaps between the interlayer contacts and the dielectric layers, the gaps resulting from said reducing the cross-section, wherein the dielectric structures have a thermal conductivity sufficiently low to reduce a reset current.

11. The method of claim 1, wherein said forming programmable resistive elements includes:
    forming programmable resistive elements including at least one of: a chalcogenide, $Pr_xCa_yMnO_3$, $PrSrMnO_3$, $ZrO_x$, a two-element memory compound, TCNQ, and PCBM.

12. A method of forming an integrated circuit with nonvolatile memory cells, comprising:
    forming conductive rows accessing the nonvolatile memory cells by row;
    forming dielectric layers above said conductive rows, including:
        forming a first dielectric layer above said conductive rows; and
        forming a second dielectric layer at least partly above the first dielectric layer, wherein the first and second dielectric layers have an etching selectivity difference;
    forming interlayer contacts through the dielectric layers to conductively connect with the conductive rows;
    reducing a cross-section of a part of the interlayer contacts in a self-aligned process, including:
        forming a third dielectric layer at least partly covering the interlayer contacts;
        removing only part of the third dielectric layer covering the interlayer contacts to leave dielectric structures at least partly covering the interlayer contacts, including wet etching said part of the third dielectric layer; and
        reducing a cross-section of a part of the interlayer contacts by removing material from a part of the interlayer contacts uncovered by the dielectric structures;
    forming programmable resistive elements of the nonvolatile memory cells to conductively connect with the interlayer contacts; and
    forming conductive columns accessing the nonvolatile memory cells by column to conductively connect with the programmable resistive elements.

13. The method of claim 12, wherein said reducing the cross-section includes:
    controlling a critical dimension of the interlayer contacts to be less than or equal to about 60 nm.

14. The method of claim 12, wherein said removing only part of the third dielectric layer includes:
    wet etching said part of the third dielectric layer for a duration, wherein the duration controls a critical dimension of said part of the, interlayer contacts achieved by said reducing the cross-section.

15. The method of claim 12, wherein said forming the third dielectric layer includes:
    forming the dielectric structures covering the interlayer contacts, the dielectric structures having a substantially triangle-shaped cross-section.

16. The method of claim 12, wherein said reducing the cross-section includes:
   dry etching the part of the interlayer contacts uncovered by the dielectric structures.

17. The method of claim 12, wherein said forming programmable resistive elements includes:
   forming programmable resistive elements including at least one of: a chalcogenide, $Pr_xCa_yMnO_3$, $PrSrMnO_3$, $ZrO_x$, a two-element memory compound, TCNQ, and PCBM.

18. An integrated circuit with nonvolatile memory cells, comprising:
   conductive rows accessing the nonvolatile memory cells by row;
   a first dielectric layer above said conductive rows;
   a second dielectric layer above said first dielectric layer, the second dielectric having a different etch rate from the first dielectric layer;
   programmable resistive elements of the nonvolatile memory cells above the second dielectric layer;
   interlayer contacts through the dielectric layers to conductively connect with the conductive rows, each including:
      a first part adjacent to and conductively connected to at least one of the programmable resistive elements, the first part having a first cross-section, the first part having a top surface, wherein the top surface is higher than the second dielectric layer; and
      a second part adjacent to and conductively connected to the first part, the second part conductively connected to the conductive rows, the second part having a second cross-section larger than the first cross-section, the second cross-section being substantially uniform between the first part and the conductive rows; and
   conductive columns accessing the nonvolatile memory cells by column to conductively connect with the programmable resistive elements.

19. The circuit of claim 18, wherein the first cross-section of the first part of each interlayer contact has a critical dimension less than or equal to about 60 nm.

20. The circuit of claim 18, wherein the programmable resistive elements includes at least one of: a chalcogenide, $Pr_xCa_yMnO_3$, $PrSrMnO_3$, $ZrO_x$, a two-element memory compound, TCNQ, and PCBM.

* * * * *